United States Patent
Managaki

(10) Patent No.: US 10,553,657 B2
(45) Date of Patent: Feb. 4, 2020

(54) LIGHT-EMITTING ELEMENT AND DISPLAY DEVICE

(71) Applicant: Japan Display Inc., Tokyo (JP)

(72) Inventor: Nobuto Managaki, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 16/180,116

(22) Filed: Nov. 5, 2018

(65) Prior Publication Data

US 2019/0165058 A1  May 30, 2019

(30) Foreign Application Priority Data

Nov. 29, 2017 (JP) ................. 2017-228807

(51) Int. Cl.
| | |
|---|---|
| *H01L 27/32* | (2006.01) |
| *H01L 27/12* | (2006.01) |
| *H01L 51/52* | (2006.01) |
| *H01L 33/40* | (2010.01) |
| *H01L 27/15* | (2006.01) |

(52) U.S. Cl.
CPC ...... *H01L 27/3232* (2013.01); *H01L 27/1225* (2013.01); *H01L 27/15* (2013.01); *H01L 33/405* (2013.01); *H01L 51/5203* (2013.01)

(58) Field of Classification Search
None
See application file for complete search history.

(56) References Cited

U.S. PATENT DOCUMENTS

| | | | | |
|---|---|---|---|---|
| 6,605,826 | B2* | 8/2003 | Yamazaki | H01L 27/3246 257/72 |
| 8,344,374 | B2* | 1/2013 | Yamazaki | H01L 27/1214 257/43 |
| 8,581,265 | B2* | 11/2013 | Hatano | H01L 27/1214 257/79 |
| 2017/0123268 | A1 | 5/2017 | Sasaki et al. | |

FOREIGN PATENT DOCUMENTS

| | | |
|---|---|---|
| JP | 2017-062902 A | 3/2017 |
| JP | 2017-107181 A | 6/2017 |
| JP | 2017-112011 A | 6/2017 |

* cited by examiner

*Primary Examiner* — Chandra Chaudhari
(74) *Attorney, Agent, or Firm* — Michael Best & Friedrich LLP

(57) ABSTRACT

Provided is a light-emitting element including a first electrode, a partition wall covering an edge portion of the first electrode, a light-confining layer in contact with a side surface of the partition wall and the first electrode, an electroluminescence layer over the first electrode and in contact with the first electrode and the light-confining layer, and a second electrode over the electroluminescence layer. A refractive index of the light-confining layer is lower than a refractive index of the electroluminescence layer.

18 Claims, 11 Drawing Sheets

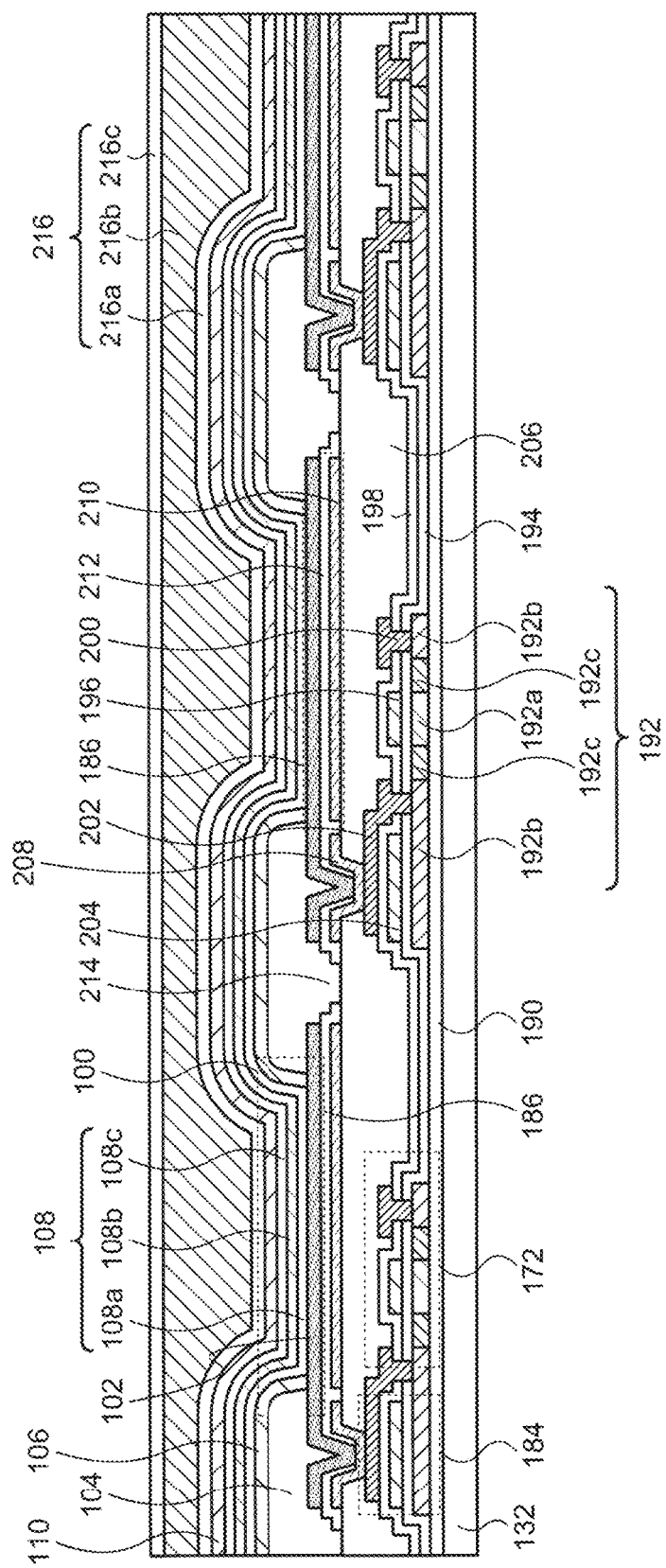

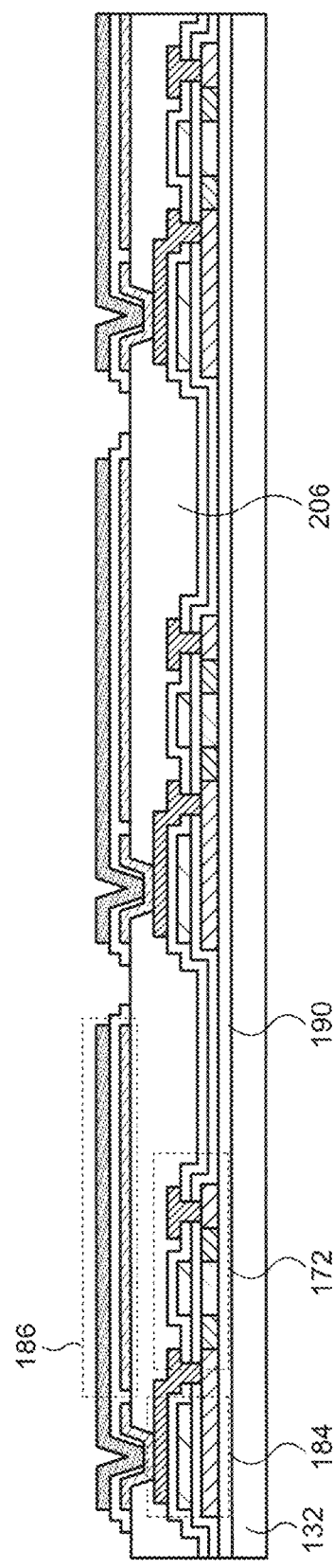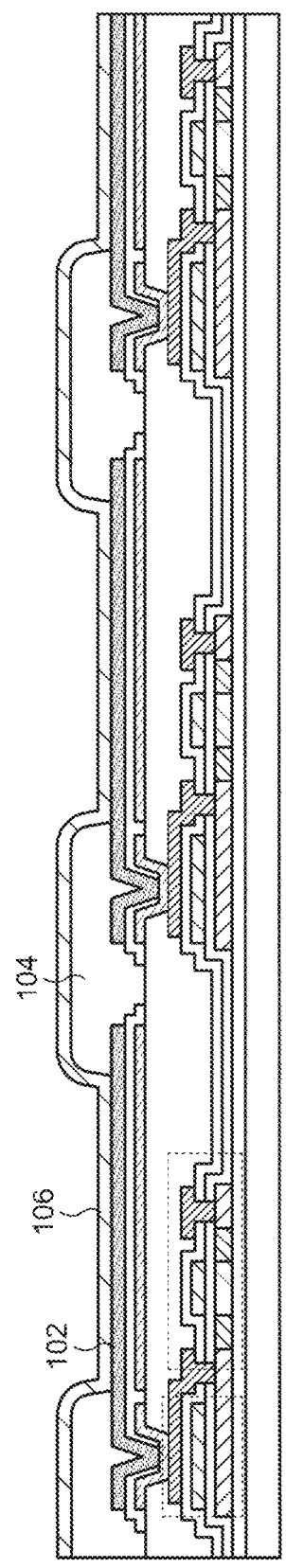

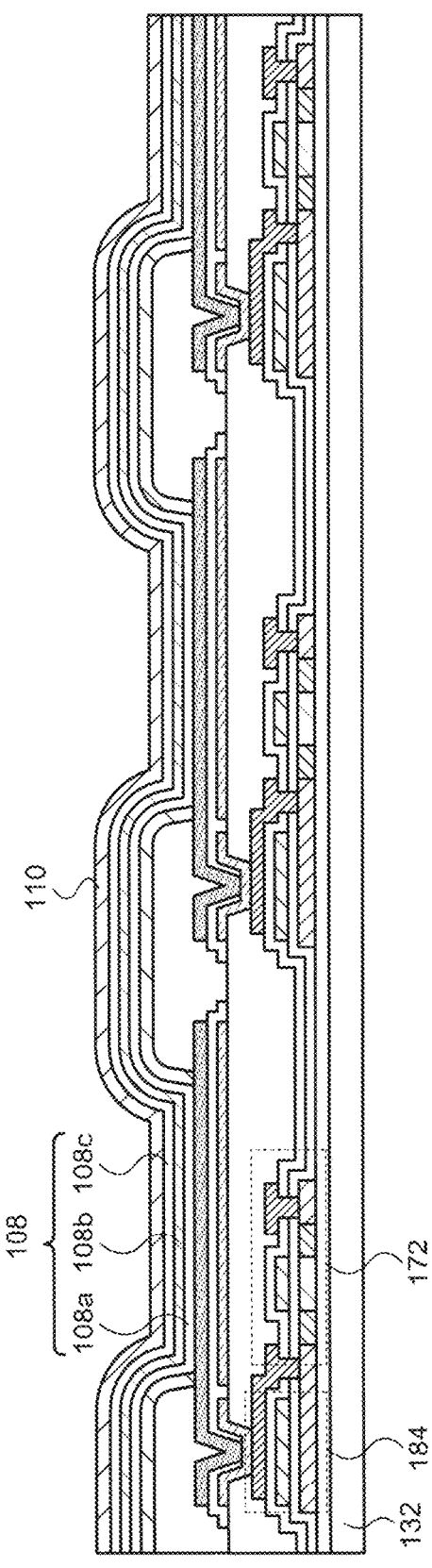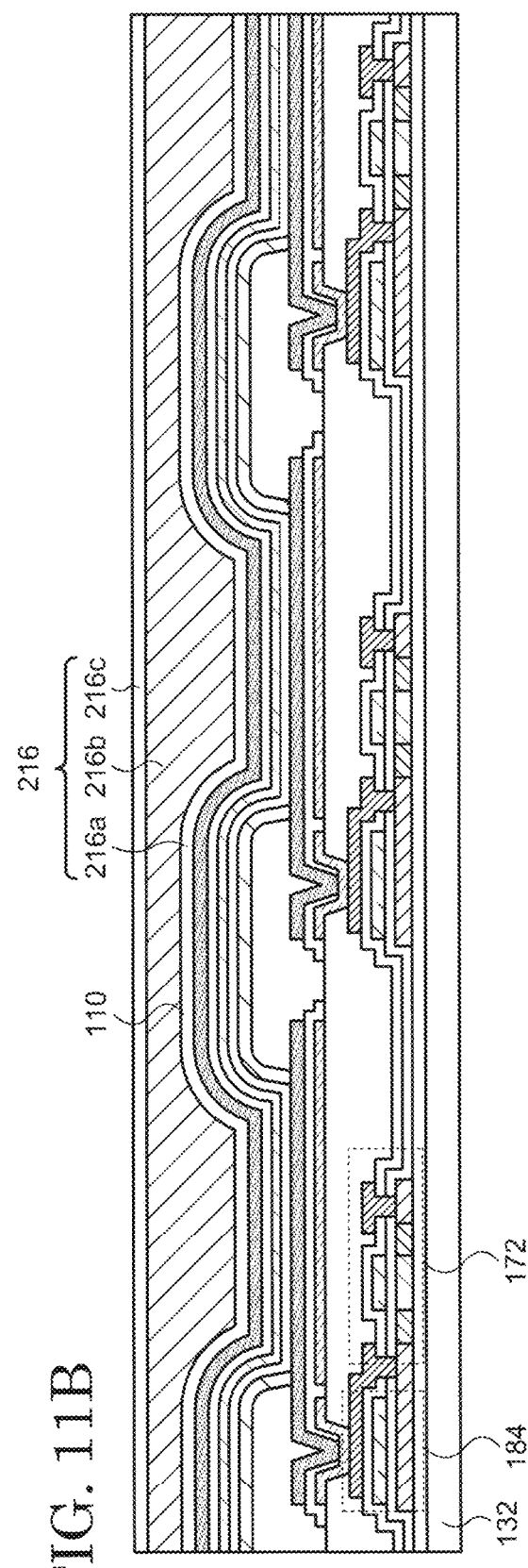

LIGHT-EMITTING ELEMENT AND DISPLAY DEVICE

CROSS REFERENCE TO RELATED APPLICATIONS

This application is based on and claims the benefit of priority from the prior Japanese Patent Application No. 2017-228807, filed on Nov. 29, 2017, the entire contents of which are incorporated herein by reference.

FIELD

An embodiment of the present invention relates to a light-emitting element, a display device including the light-emitting element, and a manufacturing method thereof.

BACKGROUND

As an example of a display device, an organic EL (Electroluminescence) display device is represented. An organic EL display device possesses an organic light-emitting element (hereinafter, referred to as a light-emitting element) in each of a plurality of pixels formed over a substrate. A light-emitting element has a layer (hereinafter, referred to as an EL layer) containing an organic compound between a pair of electrodes (cathode and anode) and is driven by supplying current to the EL layer from the pair of electrodes.

Efficiency and emission color of a light-emitting element are controlled by a structure of the EL layer and an emission material included in the EL layer. For example, appropriate selection of an emission material enables light emission with a variety of colors. Additionally, it is also possible to adjust an emission wavelength and increase emission intensity in a front direction by utilizing light-interference effects in or outside the light-emitting element. Japanese Patent Application Publications No. 2017-112011, 2017-62902, and 2017-107181 disclose that a resonance structure is formed in a light-emitting element to allow light emission obtained from an emission layer to resonate, thereby adjusting emission intensity and emission color.

SUMMARY

An embodiment of the present invention is a light-emitting element. The light-emitting element includes: a first electrode; a partition wall covering an edge portion of the first electrode; a light-confining layer in contact with a side surface of the partition wall and the first electrode; an electroluminescence layer over the first electrode and in contact with the first electrode and the light-confining layer; and a second electrode over the electroluminescence layer. A refractive index of the light-confining layer is lower than a refractive index of the electroluminescence layer.

An embodiment of the present invention is a display device. The display device includes: a first light-emitting element; a second light-emitting element adjacent to the first light-emitting element; and a partition wall between the first light-emitting element and the second light-emitting element. The first light-emitting element and the second light-emitting element each possess: a first electrode having an edge portion covered by the partition wall; a light-confining layer in contact with a side surface of the partition wall and the first electrode; an electroluminescence layer over the first electrode and in contact with the first electrode and the light-confining layer; and a second electrode over the electroluminescence layer. A refractive index of the light-confining layer is lower than a refractive index of the electroluminescence layer in each of the first light-emitting element and the second light-emitting element.

An embodiment of the present invention is a light-emitting element. The light-emitting element includes: a first electrode; a partition wall covering an edge portion of the first electrode; a first light-confining layer covering at least a part of a side surface of the partition wall; a second light-confining layer between and in contact with the first light-confining layer and the partition wall; an electroluminescence layer over the first electrode and in contact with the first electrode and the first light-confining layer; and a second electrode over the electroluminescence layer. A refractive index of the second light-confining layer is lower than a refractive index of the electroluminescence layer and a refractive index of the first light-confining layer.

An embodiment of the present invention is a display device. The display device includes: a first light-emitting element; a second light-emitting element adjacent to the first light-emitting element; and a partition wall between the first light-emitting element and the second light-emitting element. The first light-emitting element and the second light-emitting element each possess: a first electrode having an edge portion covered by the partition wall; a first light-confining layer covering at least a part of a side surface of the partition wall; a second light-confining layer between and in contact with the first light-confining layer and the partition wall; an electroluminescence layer over the first electrode and in contact with the first electrode and the first light-confining layer; and a second electrode over the electroluminescence layer. A refractive index of the second light-confining layer is lower than a refractive index of the electroluminescence layer and a refractive index of the first light-confining layer.

BRIEF DESCRIPTION OF DRAWINGS

FIG. 8 is a schematic cross-sectional view of a display device according to an embodiment of the present invention;

FIG. 9A and FIG. 9B are schematic cross-sectional views explaining a manufacturing method of a display device according to an embodiment of the present invention;

FIG. 11A and FIG. 11B are schematic cross-sectional views explaining a manufacturing method of a display device according to an embodiment of the present invention.

DESCRIPTION OF EMBODIMENTS

Hereinafter, the embodiments of the present invention are explained with reference to the drawings. The invention can be implemented in a variety of different modes within its concept and should not be interpreted only within the disclosure of the embodiments exemplified below.

The drawings may be illustrated so that the width, thickness, shape, and the like are illustrated more schematically compared with those of the actual modes in order to provide a clearer explanation. However, they are only an example, and do not limit the interpretation of the invention. In the specification and the drawings, the same reference number is provided to an element that is the same as that which appears in preceding drawings, and a detailed explanation may be omitted as appropriate.

In the present specification and claims, when a plurality of films is formed by processing one film, the plurality of films may have functions or rules different from each other. However, the plurality of films originates from a film formed as the same layer in the same process and has the same layer structure and the same material. Therefore, the plurality of films is defined as films existing in the same layer.

In the specification and the claims, unless specifically stated, when a state is expressed where a structure is arranged "over" another structure, such an expression includes both a case where the substrate is arranged immediately above the "other structure" so as to be in contact with the "other structure" and a case where the structure is arranged over the "other structure" with an additional structure therebetween.

First Embodiment

1. Basic Structure

Figure 1A:
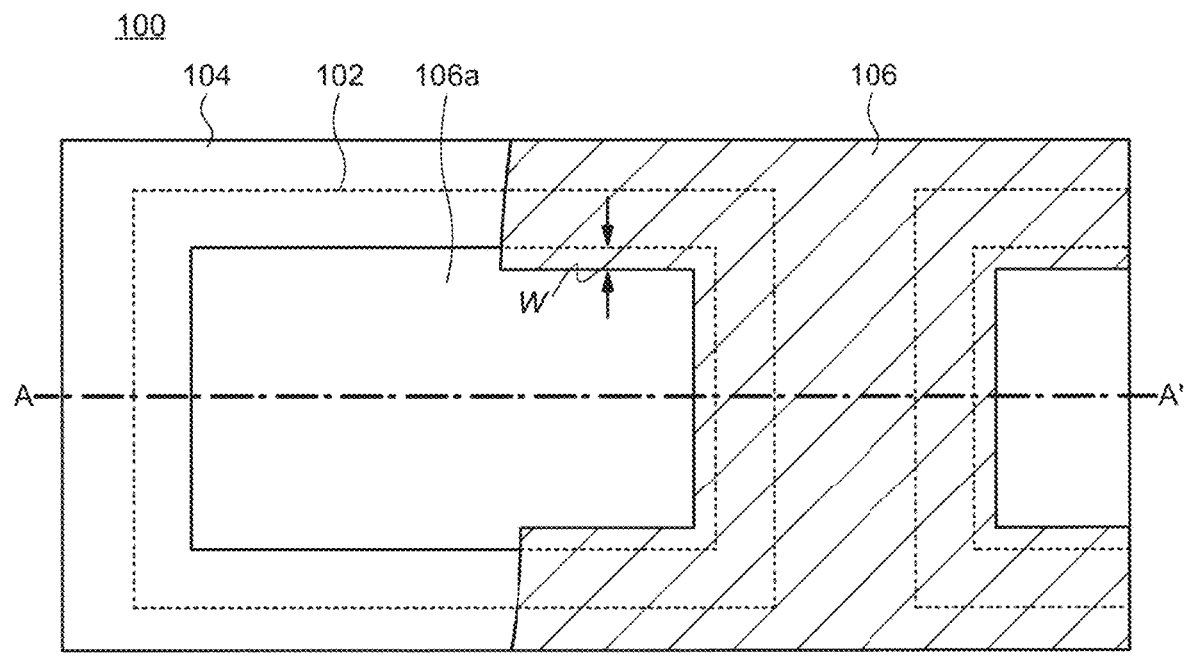
FIG. 1A and FIG. 1B are respectively a schematic top view and cross-sectional view of a light-emitting element according to an embodiment of the present invention.
Figure 1B:
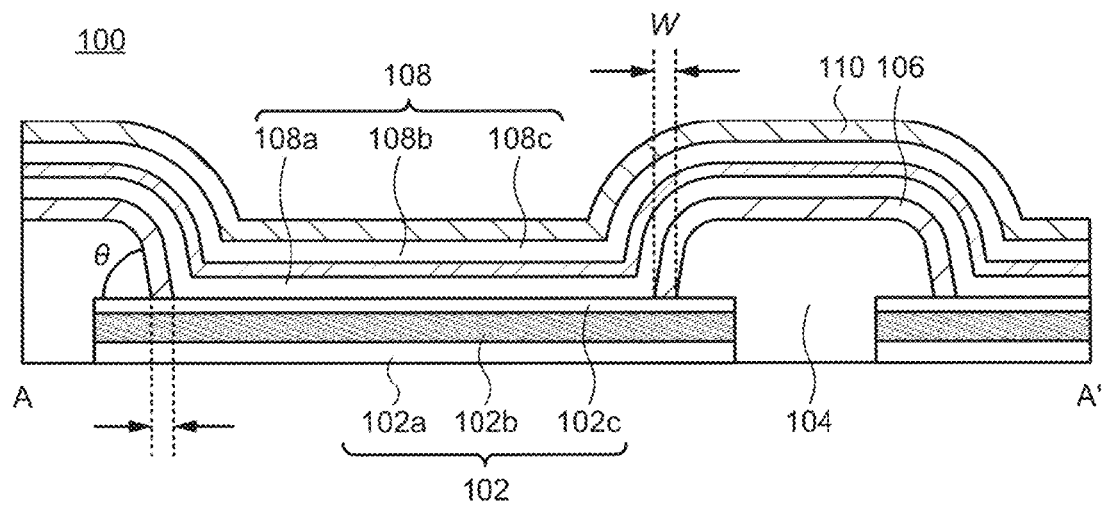

Schematic top and cross-sectional views of a light-emitting element 100 according to an embodiment of the present invention are respectively shown in FIG. 1A and FIG. 1B. One light-emitting element 100 and a part of the light-emitting element 100 adjacent thereto are shown in FIG. 1A and FIG. 1B, and a schematic view of a cross section along a chain line A-A' of FIG. 1A is FIG. 1B. A second electrode 110, an electroluminescence layer (hereinafter, referred to as an EL layer) 108, and a part of a light-confining layer 106 described below are not illustrated in FIG. 1A for visibility. As shown in FIG. 1B, the light-emitting element 100 possesses a first electrode 102, a partition wall 104, the light-confining layer 106, the EL layer 108, and the second electrode 110.

The first electrode 102 has a function to inject carriers (holes and electrons) to the EL layer 108 and reflect light emission obtained from the EL layer 108. The first electrode 102 functions as an anode or a cathode. Hereinafter, the light-emitting element 100 is explained by using an example where the first electrode 102 and the second electrode 110 respectively function as an anode and a cathode. Although a structure of the first electrode 102 can be arbitrarily selected, it is preferred that a work function of a surface thereof be high to efficiently inject holes to the EL layer 108. Moreover, the first electrode 102 preferably exhibits a high reflectance with respect to visible light in order to reflect the light emission. Therefore, it is possible to employ a stacked-layer structure of a metal with a high reflectively, such as aluminum, silver, or an alloy thereof, and a conductive oxide capable of transmitting visible light, such as indium-tin oxide (ITO) and indium-zinc oxide (IZO). For instance, a stacked-layer structure may be employed as a structure of the first electrode 102 which includes a first conductive layer 102a containing a conductive oxide, a second conductive layer 102b located over the first conductive layer 102a and containing a metal or an alloy described above, and a third conductive layer 102c located over the second conductive layer 102b and containing a conductive oxide as shown in FIG. 1B. In this structure, the high work function of the conductive oxide included in the third conductive layer 102c contributes to the hole injection. In addition, a top surface of the second conductive layer 102b serves as a reflective surface at which the light emission obtained in the EL layer 108 is reflected.

The partition wall 104 is an insulating film including a resin such as an epoxy resin, an acrylic resin, a polysiloxane resin, or a polyester resin, in contact with the first electrode 102, and covers an edge portion thereof (FIG. 1A and FIG. 1B). In other words, the partition wall 104 possesses a plurality of openings, and the first electrode 102 is exposed in the openings. A slope of a side surface of the partition wall 104 is preferred to be relatively steep. For example, an angle θ between the side surface of the partition wall 104 and a bottom surface of the partition wall 104 in contact with the first electrode 102 (see FIG. 1B) may be equal to or more than 60° and less than 90°, equal to or more than 70° and less than 90°, or equal to or more than 80° and less than 90°. The partition wall 104 is configured to be optically uniform. That is, the refractive index is substantially uniform in the whole of the partition wall 104, and no light-scattering structure (microparticles, holes, and the like) is included.

The light-confining layer 106 is an insulating film, in contact with the side surface of the partition wall, and covers at least a part of the side surface. An example is demonstrated in FIG. 1B in which the light-confining layer 106 is formed to cover the side surface and a top surface of the partition wall 104. In this case, the light-confining layer 106 is shared by the adjacent light-emitting elements 100 and disposed so as to extend from one of the light-emitting elements 100 to the adjacent light-emitting element 100. The light-confining layer 106 may be configured so that a permittivity thereof is smaller than that of the EL layer 108. For example, the light-confining layer 106 may be formed so that a difference in permittivity between the light-confining layer 106 and the EL layer 108 is equal to or more than 0.2 F/m or equal to or more than 0.3 F/m. More specifically, the permittivity of the light-confining layer 106 may be equal to or more than 3.0 F/m and equal to or less than 5.0 F/m or equal to or more than 3.0 F/m and equal to or less than 4.0 F/m. Alternatively, in view of the proportional relationship between a square of a refractive index and a permittivity of a substrate, the light-confining layer 106 may be configured so that a refractive index of the light-confining layer 106 is smaller than a refractive index of the EL layer 108. For example, the light-confining layer 106 is formed so that a difference in a refractive index between the light-confining layer 106 and the EL layer 108 is equal to or more than 0.2 or equal to or more than 0.3. More specifically, the refractive index of the light-confining layer 106 may be equal to or more than 1.4 and equal to or less than 1.6 or equal to or more than 1.4 and equal to or less than 1.5. As such a material, a polymer exemplified by a polyimide or an acrylic resin is represented. When the light-confining layer 106 and the partition wall 104 each include an acrylic resin, the materials thereof are selected so that the permittivity and the refractive index of the former is smaller than those of the latter.

Alternatively, the light-confining layer 106 may include a fluorine-containing polymer as a material having a low refractive index. As such a polymer, polytetrafluoroethylene, poly(vinylidene fluoride), a derivative thereof as well as a poly(vinyl ether), a polyimide, a poly(methacrylic ester), a poly(acrylic ester), and a polysiloxane having fluorine in a main or side chain are represented, for example. These polymers may be intramolecularly or intermolecularly cross-linked.

Alternatively, the light-confining layer 106 may contain an inorganic compound such as a metal fluoride exemplified by lithium fluoride, magnesium fluoride, and calcium fluoride or silicon oxide including boron oxide or phosphorus oxide as a material with a relatively low refractive index.

The light-confining layer 106 may be configured to have a thickness in a direction parallel to the surface of the first electrode 102, that is, a width W of a surface in contact with the first electrode 102 (see FIG. 1A and FIG. 1B), which is equal to or more than 50 nm and equal to or less than 200 nm. Alternatively, the light-confining layer 106 may be configured so that the width W is equal to or less than one fourth of a wavelength λ of the emission from the EL layer 108, that is, $W \leq \lambda/4$ is satisfied. In other words, the light-confining layer 106 can be configured so that the width W is equal to or larger than 50 nm and equal to or smaller than $\lambda/4$. Here, the emission wavelength is a peak wavelength of the emission obtained from the light-emitting element 100 or an emission peak wavelength of an emission material included in the EL layer 108 described below.

The EL layer 108 is disposed over the first electrode 102 so as to be in contact with the first electrode 102 and the light-confining layer 106. In the example demonstrated in FIG. 1B, the EL layer 108 is located over the light-confining layer 106 and in contact with a side surface and a top surface of the light-confining layer 106. In the specification and the claims, the EL layer 108 means the film sandwiched by the first electrode 102 and the second electrode 110.

The structure of the EL layer 108 is arbitrarily determined, and the EL layer 108 is structured by appropriately combining functional layers such as a hole-injection layer, a hole-transporting layer, an emission layer, an electron-transporting layer, an electron-injection layer, a hole-blocking layer, an electron-blocking layer, an exciton-blocking layer, and a charge-generation layer. One functional layer may have a plurality of functions. For example, an emission layer including an emission material may also serve as an electron-transporting layer or a hole-transporting layer. In addition, each layer may be formed with a single material or a stack of different materials. The structure of the EL layer 108 may be the same or different between the adjacent light-emitting elements 100. For example, the plurality of light-emitting elements 100 may be configured so that a material included in an emission layer is different between the adjacent light-emitting elements 100. In this case, different emission colors can be obtained from the adjacent light-emitting elements 100. In the example demonstrated in FIG. 1B, three layers involving a hole-transporting layer 108a, an emission layer 108b, and an electron-transporting layer 108c are illustrated as the typical functional layers. Here, when the EL layer 108 is structured with a plurality of functional layers, the permittivity and the refractive index of the EL layer 108 mean those of the entire EL layer 108.

The second electrode 110 is disposed over and in contact with the EL layer 108. The second electrode 110 is configured as a semi-transparent, semi-reflective electrode partly reflecting and partly transmitting visible light and is preferred to have a relatively low work function in order to efficiently inject electrons to the EL layer 108. For instance, the second electrode 110 may include magnesium, lithium, silver, or an alloy thereof (e.g., Mg—Ag) and may be formed at a thickness which allows visible light to partly pass therethrough. A specific thickness is selected from a range from 5 nm to 100 nm. A layer including a conductive oxide capable of transmitting visible light, such as ITO and IZO, may be further stacked over a film including the metal described above.

A potential difference provided between the first electrode 102 and the second electrode 110 enables injection of holes and electrons to the EL layers 108 from the former and the latter, respectively. The holes are transported to the emission layer 108b through the hole-transporting layer 108a, while the electrons are transported to the emission layer 108b through the electron-transporting layer 108c. Recombination of the hole and electron in the emission layer 108b results in an excited state of an emission material included in the emission layer 108b. When the excited state relaxes to a ground state, light of a wavelength corresponding to an energy difference between the excited state and the ground state is radiated and is observed as the light emission from the light-emitting element 100.

2. Optical Adjustment

In the light-emitting element 100, a vertical-mode resonance structure and a lateral-mode resonance structure are formed as explained below.

2-1. Vertical-Mode Resonance Structure

Figure 2A:
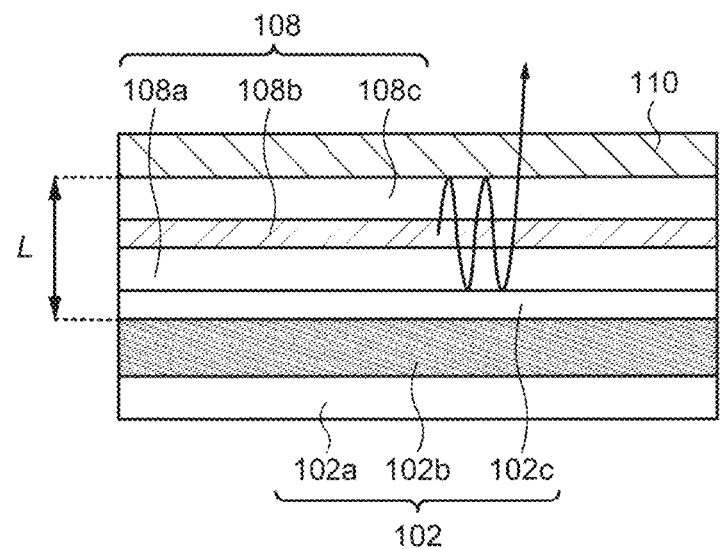
FIG. 2A and FIG. 2B are schematic cross-sectional views of a light-emitting element according to an embodiment of the present invention.

An enlarged cross-sectional view of a part of the light-emitting element 100 is shown in FIG. 2A. As described above, the first electrode 102 is configured to reflect visible light, and the second electrode 110 is configured to partly transmit and partly reflect visible light. Hence, the light emitted from the emission layer 108b is reflected at the reflective surface of the first electrode 102 and a bottom surface of the second electrode 110 and resonates. Namely, a resonance structure is constructed by the reflective surface of the first electrode 102 and the bottom surface of the second electrode 110. The interference effect attainable by this resonance is determined by an optical distance L between the reflective surface of the first electrode 102 and the bottom surface of the second electrode 110 and a spectrum of the emission from the emission layer 108b. In the case where the reflective surface is a top surface of the first electrode 102, the optical distance L is a sum of the products of the refractive indexes and the thicknesses of each functional layer in the EL layer 108. As described above, the reflective surface is the top surface of the second conductive layer 102b in the example demonstrated n FIG. 2A. In this case, the optical length L is a sum of the products of the refractive indexes and the thickness of each functional layer in the EL layer 108 and the product of the refractive index and the thickness of the third conductive layer 102c. The structure and materials in the EL layer 108 and the material and the thickness of the third conductive layer 102c are appropriately selected and adjusted so that the optical length L is consistent with an odd multiple of one fourth of the wavelength of the emission ($\lambda/4$) obtained from the EL layer 108. When the optical length L is adjusted in such a way, the light having a wavelength consistent with the optical length L is repeatedly reflected between the reflective surface of the first electrode 102 and the bottom surface of the second electrode 110 to be amplified by the interference effect, while the light having a wavelength inconsistent with the optical length L is attenuated. Accordingly, a half-width half maximum of the light emission obtained from the light-emitting element 100 is decreased, color purity is improved, and the luminance of the light-emitting element 100 in the front direction, i.e., emission efficiency, is increased.

2-2. Lateral-Mode Resonance Structure

Figure 2B:
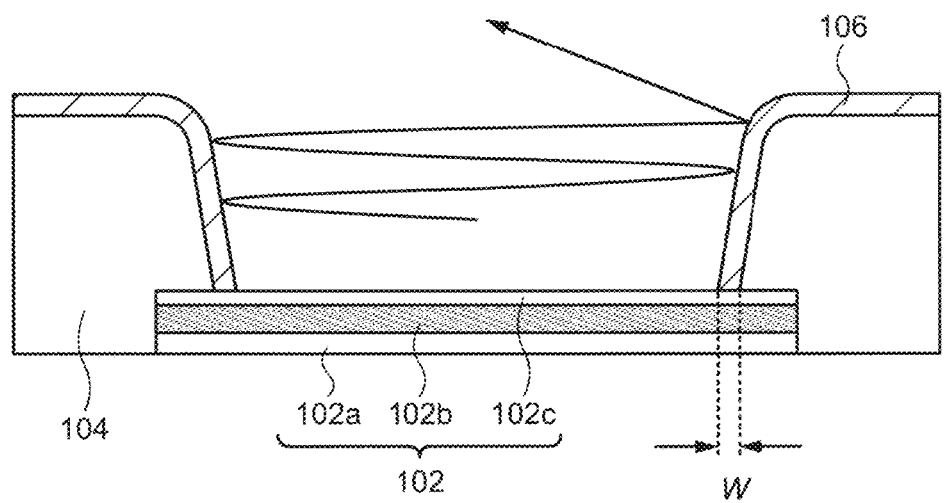

An enlarged view of a part of the cross section of the light-emitting element 100 is shown in FIG. 2B. Here, the El layer 108 and the second electrode 110 are omitted for visibility. Although the light emitted in a vertical direction from the emission layer 108 (that is, a normal direction of the top surface of the first electrode 102 or a direction in an angle close thereto) is amplified in the vertical-mode resonance structure described above, the light emitted in a lateral direction (a direction parallel to the top surface of the first electrode 102 or a direction in an angle close thereto) cannot be efficiently extracted.

However, the light-confining layer 106 is provided in the light-emitting element 100 as described above. The light-confining layer 106 and the EL layer 108 are different in refractive index and permittivity from each other, and the refractive index and permittivity of the former are smaller than those of the latter. Therefore, the light obtained from the emission layer 108b is reflected at an interface between the EL layer 108 and the light-confining layer 106. Additionally, the width W of the light-confining layer 106 is adjusted to be equal to or more than 50 nm and equal to or less than 200 nm or equal to or more than 50 nm and equal to or less than $\lambda/4$ as described above. Hence, the light emitted from the light-emitting layer 108b is effectively prevented from leaking to the partition wall 104. As a result, loss of light in a lateral direction is small even if the light is repeatedly reflected between the interfaces between the EL layer 108 and the light-confining layer 106. Here, the side surface of the partition wall 104 is inclined from the top surface of the first electrode 102, which causes the interface between the EL layer 108 and the light-confining layer 106 to be included from the top surface of the first electrode 102. Therefore, the direction of the light gradually varies to the lateral direction while repeating the reflection at this interface and is extracted to the outside of the light-emitting element 100 when the direction exceeds a critical angle of the second electrode 110. Such a mechanism (reflection structure) enables the light obtained from the emission layer 108b to be efficiently extracted, allowing production of a light-emitting element exhibiting high emission efficiency.

Note that a width of the partition wall 104, the angle θ of the side surface of the partition wall 104, the area of the first electrode 102 may be adjusted so that the optical length between the opposing interfaces between the EL layer 108 and the light-confining layer 106 is consistent with an odd multiple of $\lambda/4$. With this structure, the emitted light is amplified by the light-interference effect even in the lateral direction, by which the half-width half maximum of the light emission obtained from the light-emitting element 100 is decreased, color purity is improved, and the luminance in the front direction, i.e., emission efficiency, is increased.

3. Modified Example

Figure 3A:
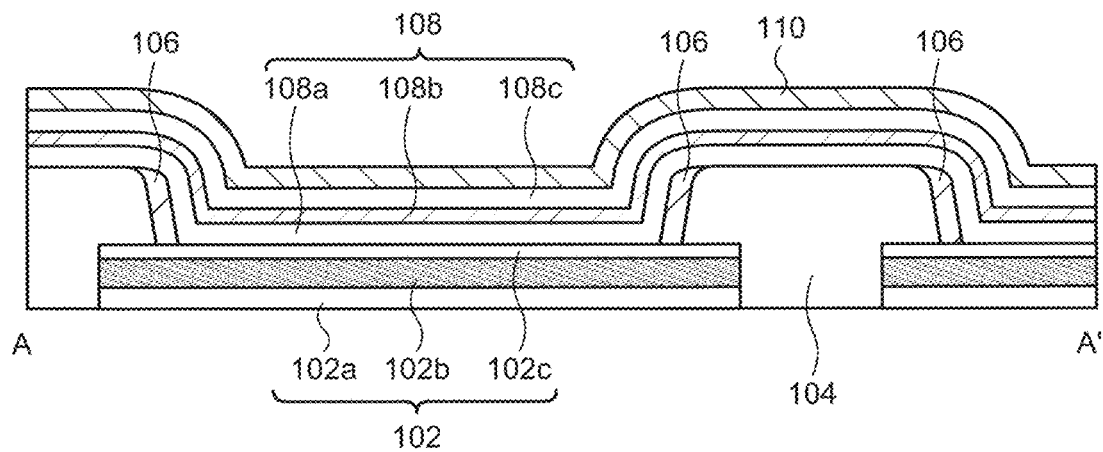
FIG. 3A to FIG. 3C are schematic cross-sectional views of a light-emitting element according to an embodiment of the present invention.
Figure 3B:
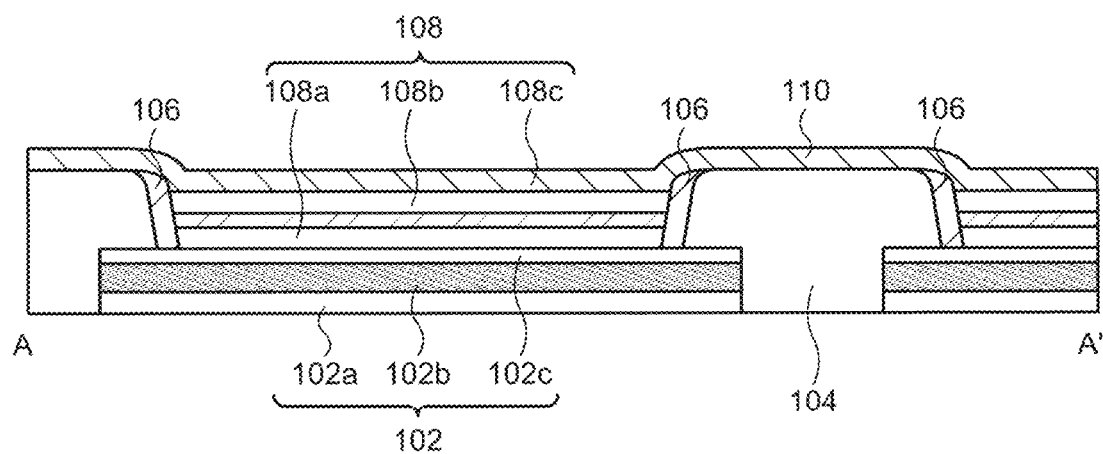
Figure 3C:
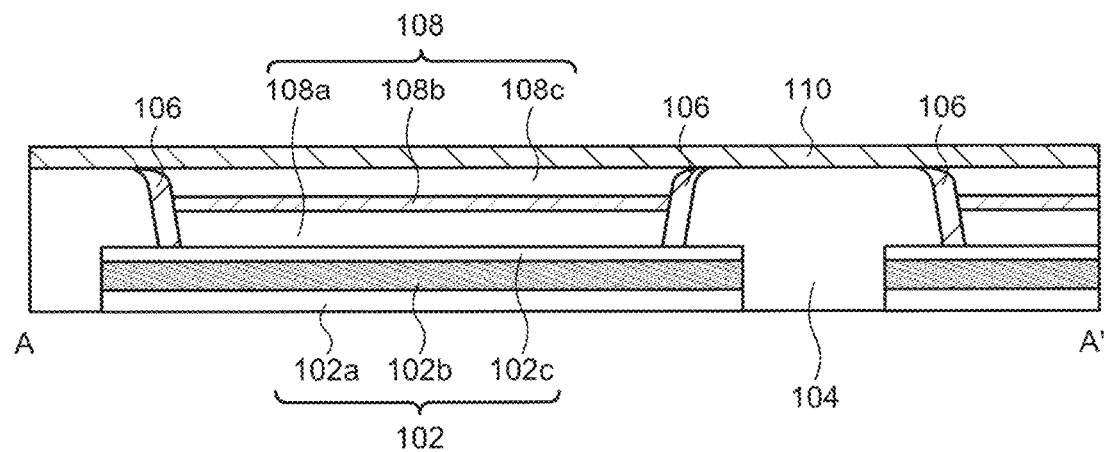

The structure of the light-emitting element 100 is not limited to the structure described above. For example, the light-confining layer 106 may not be in contact with at least a part of a top surface of the partition wall 104 and may be spaced apart from the light-confining layer 106 of the adjacent light-emitting element 100 as shown in FIG. 3A. In this case, the light-confining layer 106 covers at least a part of the side surface of the partition wall 104, and the EL layer 108 is in contact with the top surface of the partition wall 104. Alternatively, The EL layer 108 may be separated between the adjacent light-emitting elements 100 as shown in FIG. 3B. In this case, the second electrode 110 may be in contact with the partition wall 104 and the light-confining layer 106, and a top surface of the EL layer 108, the top surface of the partition wall 104, and a top surface of the light-confining layer 106 may exist in the same plane. Furthermore, a top surface of the EL layer 108, the top surface of the partition wall 104, and a top surface of the light-confining layer 106 may exist in the same layer as shown in FIG. 3C.

In the light-emitting element 100 according to the present embodiment, not only the light emitted from the emission layer 108b in the vertical direction resonates in a vertical mode to be amplified, but also the light emitted in the lateral direction repeats reflection without being attenuated and is finally extracted from the light-emitting element 100 as described above. Hence, the light-emitting element 100 shows high light-extraction efficiency. In addition, the light-emitting element 100 is able to provide light with high color purity at high efficiency mainly due to the resonance structure in the vertical mode.

Second Embodiment

In the present embodiment, a light-emitting element 120 different in structure from the light-emitting element 100 is explained. An explanation of the structure the same as or similar to that of the First Embodiment may be omitted.

Figure 4A:
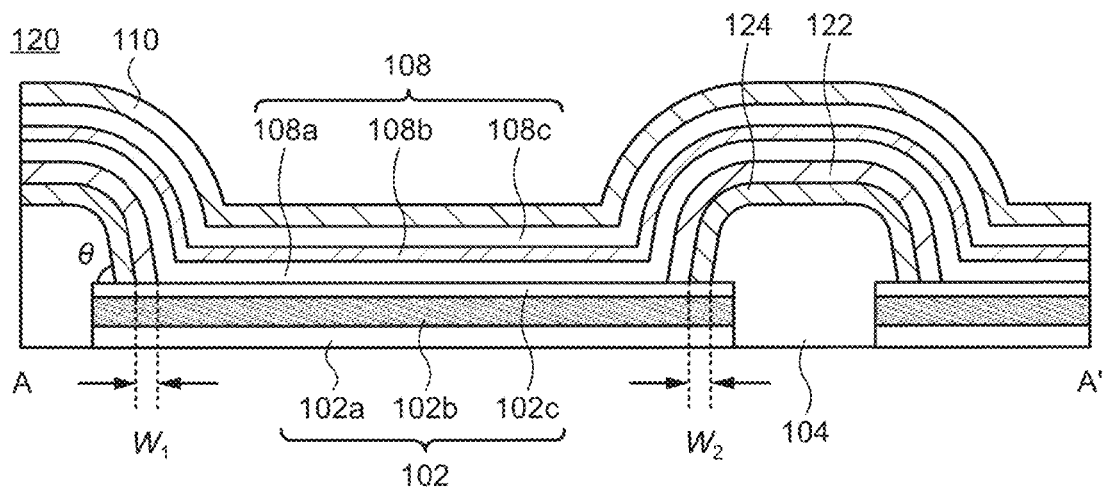
FIG. 4A to FIG. 4C are schematic cross-sectional views of a light-emitting element according to an embodiment of the present invention.

A schematic cross-sectional view of the light-emitting element 120 is shown in FIG. 4A. This cross-sectional view corresponds to the cross section in FIG. 1B. As demonstrated in FIG. 4A, the light-emitting element 120 is different from the light-emitting element 100 in that it has two stacked light-confining layers. More specifically, the light-emitting element 120 is different from the light-emitting element in that it has a first light-confining layer 122 covering at least a part of the side surface of the partition wall 104 and a second light-confining layer 124 in contact with and sandwiched by the first light-confining layer 122 and the partition wall 104.

The first light-confining layer 122 is configured so that a permittivity thereof is the same as or close to that of the EL layer 108. Specifically, the light-confining layer 122 is provided so that a difference in permittivity between the light-confining layer 122 and the EL layer 108 is less than 0.2 F/m. Alternatively, the first light-confining layer 122 is configured so that a refractive index thereof is the same as or close to that of the EL layer 108. Specifically, the refractive index of the first light-confining layer 122 is more than 1.6 and less than 1.9.

On the other hand, the second light-confining layer 124 corresponds to the light-confining layer 106 of the First Embodiment, and a permittivity and a refractive index thereof are lower than those of the EL layer 108 and the first light-confining layer 122. Specifically, the permittivity of the second light-confining layer 124 may be lower than those of the EL layer 108 and the first light-confining layer 122 by 0.2 F/m or more or 0.3 F/m or more and may be specifically equal to or more than 3.0 F/m and equal to or less than 5.0

F/m or equal to or more than 3.0 F/m and equal to or less than 4.0 F/m. The refractive index of the second light-confining layer 124 may be lower than those of the EL layer 108 and the first light-confining layer 122 by 0.2 or more or 0.3 or more and may be specifically equal to or more than 1.4 and equal to or less than 1.6 or equal to or more than 1.4 and equal to or less than 1.5. As a specific material, the material usable in the light-confining layer 106 of the First Embodiment can be used for the second light-confining layer 124. Moreover, similar to the light-confining layer 106, the second light-confining layer 124 is configured so that a thickness in a direction parallel to the surface of the first electrode 102, that is, a width $W_2$ of a surface in contact with the first electrode 102 (see FIG. 4A) is equal to or more than 50 nm and equal to or less than 200 nm or $\lambda/4$. Note that a thickness of the first light-confining layer 122 in a direction parallel to the surface of the first electrode 102, that is, a width $W_1$ of a surface in contact with the first electrode 102 (see FIG. 4A) is adjusted so that a sum of the widths $W_1$ and $W_2$ is more than $\lambda/4$ and equal to or less than $\lambda$.

Figure 4B:
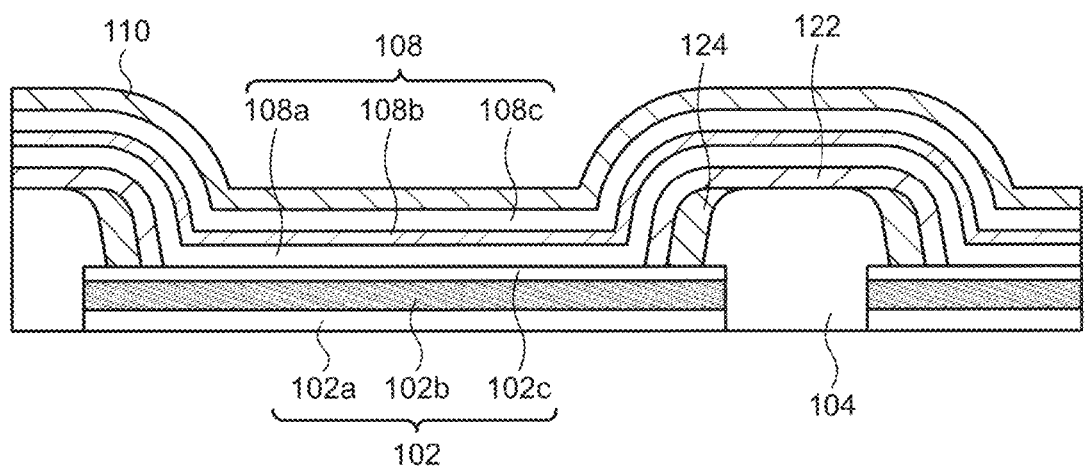
Figure 4C:
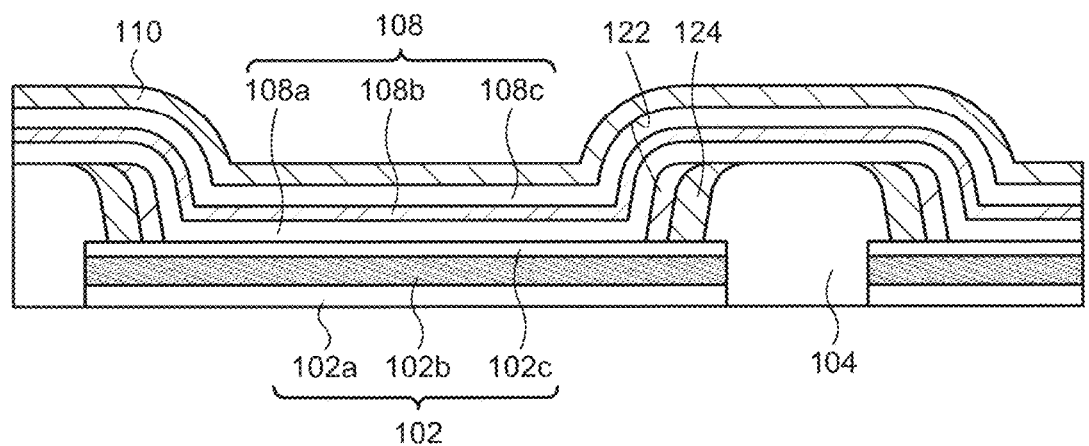
Figure 5A:
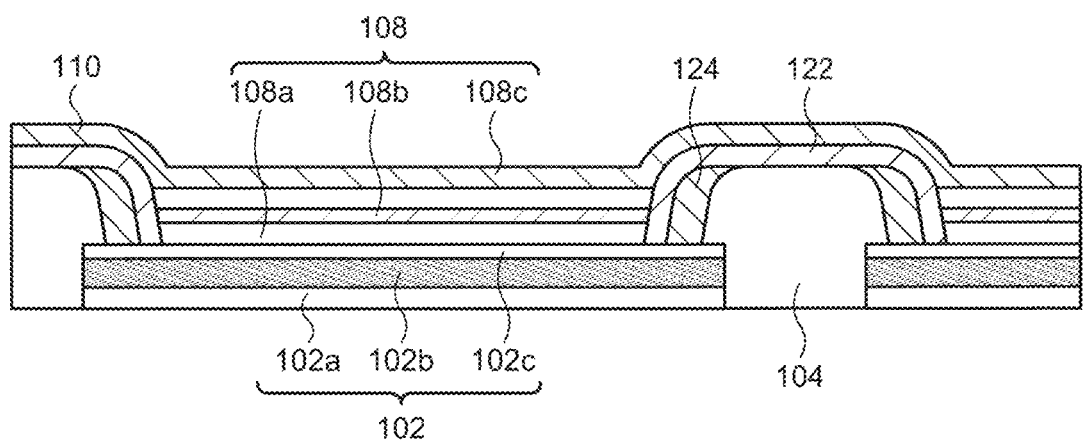
FIG. 5A to FIG. 5C are schematic cross-sectional views of a light-emitting element according to an embodiment of the present invention.
Figure 5B:
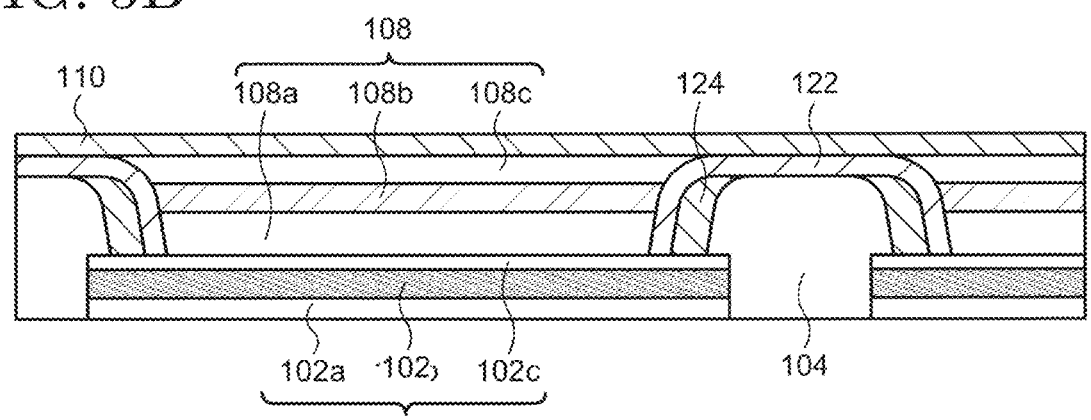
Figure 5C:
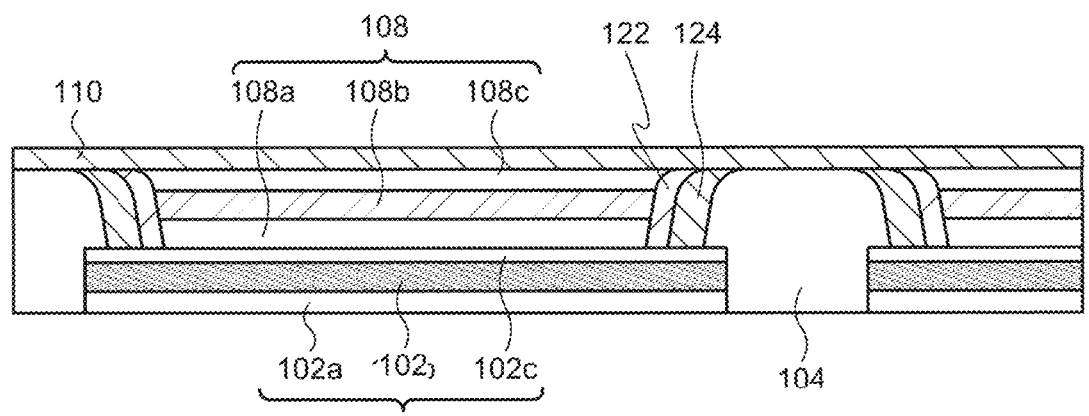

In the light-emitting element 120 shown in FIG. 4A, the first light-confining layer 122 and the second light-confining layer 124 are each shared by the adjacent light-emitting elements 120 and are disposed so as to extend from one light-emitting element 120 to the adjacent light-emitting element 120. However, the structure of the light-emitting element 120 is not limited thereto, and the second light-confining layer 124 may be separated between the adjacent light-emitting elements 120 as shown in FIG. 4B, for example. In this case, the first light-confining layer 122 may be in contact with the top surface of the partition wall 104. Alternatively, the first light-confining layer 122 may be separated from the adjacent light-emitting elements 120 as shown in FIG. 4C. In this case, the EL layer 108 is in contact with the top surface of the partition wall 104. Alternatively, the EL layers 108 may be separated between the adjacent light-emitting elements 120 as shown in FIG. 5A to FIG. 5C. In this case, the second electrode 110 may be in contact with the first light-confining layer 122 as shown in FIG. 5A and FIG. 5B or in contact with the partition wall 104, the first light-confining layer 122, and the second light-confining layer 124 as shown in FIG. 5C. Furthermore, the top surface of the EL layer 108 and a top surface of the first light-confining layer 122 may exist in the same plane (FIG. 5B), or all of the top surfaces of the EL layer 108, the first light-confining layer 122, and the second light-confining layer 124 may exist in the same plane.

In the structure described above, the light emitted in the lateral direction from the emission layer 108*b* is reflected at an interface between the first light-confining layer 122 and the second light-confining layer 124. Additionally, a leakage of the light from the second light-confining layer 124 does not readily occur because the thickness $W_2$ of the second light-confining layer 124 is small. Therefore, similar to the light-emitting element 100, an increase in emission efficiency due to the vertical-mode resonance is realized, and the light in the lateral direction from the light-emitting element 100 can be efficiently extracted. Accordingly, implementation of the present embodiment enables production of a light-emitting element with high color purity and emission efficiency.

Third Embodiment

In the present embodiment, a display device 130 having the light-emitting elements 100 shown in FIG. 1A and FIG. 1B and a manufacturing method thereof are explained. An explanation of the structures the same as or similar to those of the First and Second Embodiments may be omitted.

1. Outline Structure

Figure 6:
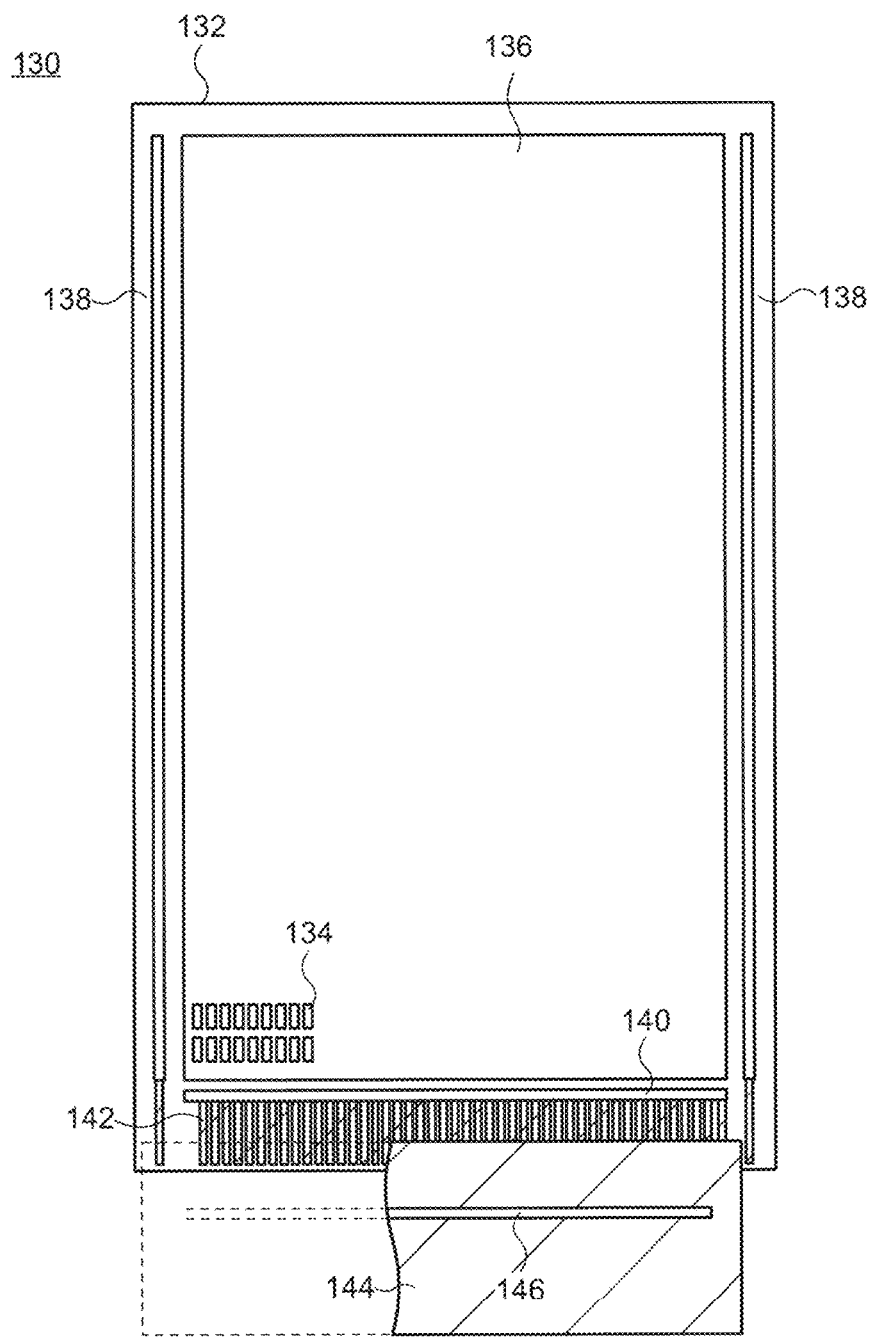
FIG. 6 is a schematic top view of a display device according to an embodiment of the present invention.

A schematic top view of the display device 130 is shown in FIG. 6. The display device 130 possesses a substrate 132 and has a variety of patterned insulating films, semiconductor films, and conductive films thereover. Appropriate combination of these films allows the formation of a plurality of pixels 134 and driver circuits (scanning-line driver circuits 138, signal-line driver circuit 140) for driving the pixels 134. Each pixel 134 is a minimum unit providing color information and a region including a pixel circuit for driving the light-emitting element 100 as described below. The plurality of pixels 104 is periodically arranged and defines a display region 136.

The scanning-line driver circuits 138 and the signal-line driver circuit 140 are arranged in a periphery of the display region 136. Wirings 142 extend from the display region 136, the scanning-line driver circuits 138, and the signal-line driver circuit 140 to a side of the substrate 132 and are exposed at a vicinity of an edge portion of the substrate 132 to form terminals (not illustrated). The wirings 142 are electrically connected to a connector 144 such as a flexible printed circuit substrate (FPC) through the terminals. In the example shown here, a driver IC 146 having an integrated circuit formed over a semiconductor substrate is further mounted over the connector 144. Image signals and a power source are supplied from an external circuit (not illustrated) through the driver IC 146 and the connector 144 and transmitted to each pixel 134 through the scanning-line driver circuits 138 and the signal-line driver circuit 140 by the wirings 142. The pixels 104 are controlled and driven on the basis of the image signals and the power source, by which an image is displayed on the display region 136. A configuration of the driver circuits and the driver IC 146 is not limited to that shown in FIG. 6: the driver IC 146 may be mounted over the substrate 132, and the function of the signal-line driver circuit 140 may be integrated with the driver IC 146, for example.

2. Structure of Pixel 2-1. Pixel Circuit

As described above, the pixel circuit including the light-emitting element 100 is fabricated in each pixel 134 with a variety of patterned insulating films, semiconductor films, and conductive films. A structure of the pixel circuit may be arbitrarily selected, and an example is illustrated in FIG. 7 as an equivalent circuit.

Figure 7:
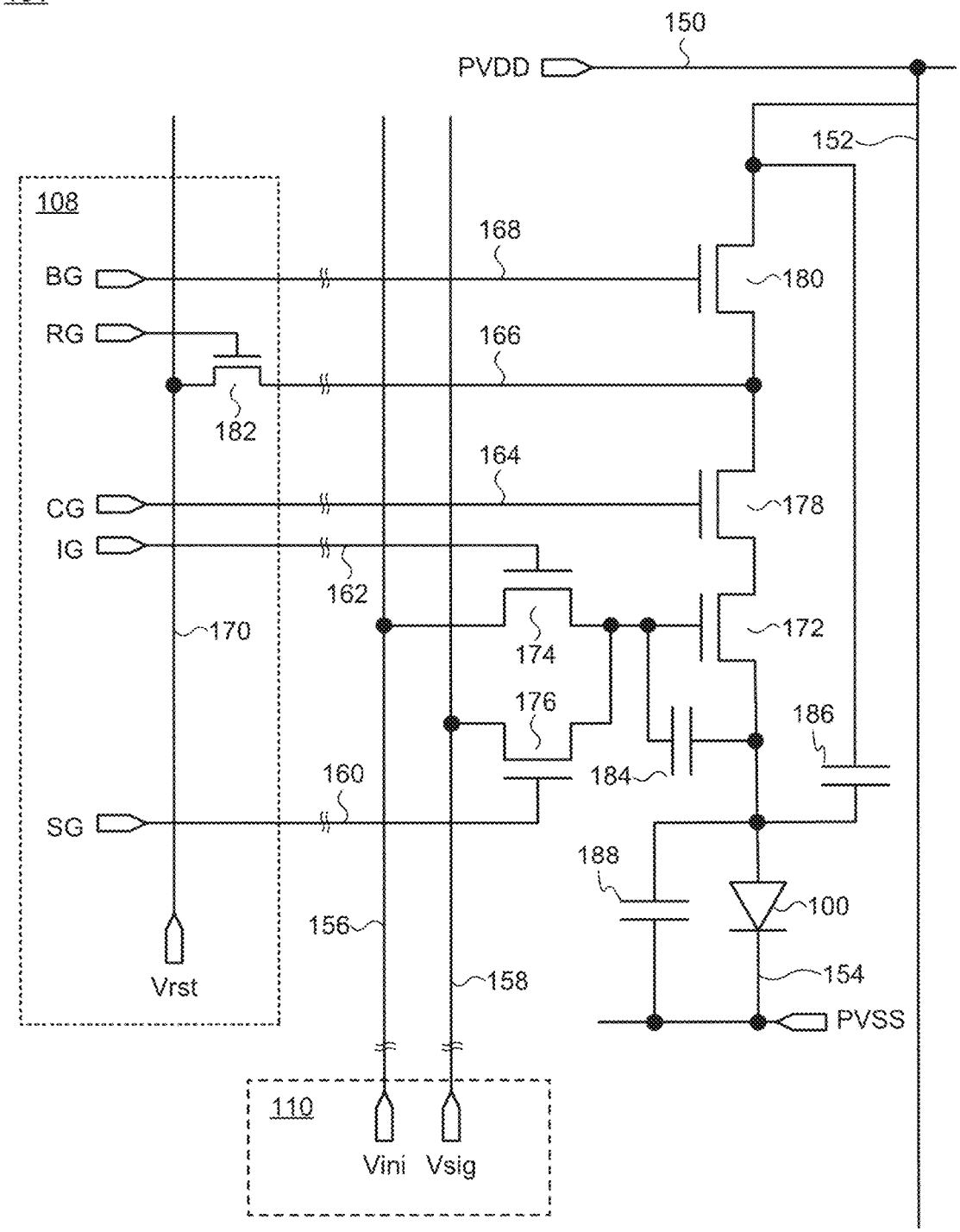
FIG. 7 is an example of an equivalent circuit of a pixel of a display device according to an embodiment of the present invention.

The pixel circuit shown in FIG. 7 possesses a driving transistor 172, an emission-controlling transistor 180, a compensating transistor 178, an initialization transistor 174, a writing transistor 176, a storage capacitor 184, and a supplementary capacitor 186 in addition to the light-emitting element 100. A capacitor 188 is not an independent capacitor element but parasitic capacitance of the light-emitting element 100. A high potential PVDD is provided to a high-potential power-source line 150, and a potential thereof is supplied to the pixels 134 connected to each column through a current-supplying line 152. The light-emitting element 100, the driving transistor 172, the emission-controlling transistor 180, and the compensating transistor 178 are connected in series between the high-potential power-source line 150 and a low-potential power source line 154. The low-potential power source line 154 is provided with a low potential PVSS.

One terminal of the driving transistor 172 is electrically connected to the high-potential power-source line 150 through the emission-controlling transistor 180 and the compensating transistor 178, and the other terminal is electrically connected to the light-emitting element 100. A gate of the driving transistor 172 is electrically connected to a first signal line 156 through the initialization transistor 174 and is also electrically connected to a second signal line 158 through the writing transistor 176. An initialization signal Vini is provided to the first signal line 156, while an image signal Vsig is provided to the second signal line 158. The initialization signal Vini is a signal which provides an initialization potential at a constant level. Operation (on/off) of the writing transistor 176 is controlled by a scanning signal SG supplied to a write-controlling scanning line 160 connected to a gate thereof. A gate of the initialization transistor 174 is connected to an initialization-control scanning line 162 provided with an initialization-control signal IG, and operation thereof is controlled with the initialization-control signal IG. When the writing transistor 176 is on and the initialization transistor 174 is off, a potential of the image signal Vsig is provided to the gate of the driving transistor 172. On the other hand, when the writing transistor 176 is off, and the initialization transistor 174 is on, a potential of the initialization signal Vini is provided to the gate of the driving transistor 172.

A compensation-control scanning line 164 applied with a compensation-control signal CG and an emission-control scanning line 168 applied with an emission-control signal BG are respectively connected to the gates of the compensating transistor 178 and the emission-controlling transistor 180. A reset-controlling line 166 is connected to one terminal of the driving transistor 172 through the compensating transistor 178. The reset-controlling line 166 is connected to a reset transistor 182 disposed in the scanning-line driver circuits 138. The reset transistor 182 is controlled by a reset-control signal RG by which a reset potential Vrst supplied to a reset signal line 170 can be applied to one terminal of the driving transistor 172 through the compensating transistor 178.

The storage capacitor 184 is disposed between the other terminal and the gate of the driving transistor 172. One terminal of the supplementary capacitor 186 is connected to the other terminal of the driving transistor 172, and the other terminal is connected to the high-potential power-source line 150. The supplementary capacitor 186 may be provided so that the other terminal is connected to the low-potential power-source line 154. The storage capacitor 184 and the supplementary capacitor 186 are formed in order to maintain a gate-source voltage Vgs corresponding to the image signal Vsig when the image signal Vsig is provided to the gate of the driving transistor 172.

The signal-line driver circuit 140 respectively outputs the initialization signal Vini and the image signal Vsig to the first signal line 156 and the second signal line 158. The scanning-line driver circuits 138 respectively output the scanning signal SG, the initialization-control signal IG, the compensation-control signal CG, the emission-control signal BG, and the reset-control signal RG to the write-controlling scanning line 160, the initialization-control scanning line 162, the compensation-control scanning line 164, the emission-control scanning line 168, and a gate of the reset transistor 182.

2-2. Cross-Sectional Structure

A schematic cross-sectional view of the display device 130 is shown in FIG. 8. In FIG. 8, a cross-sectional structure of the driving transistors 172, the storage capacitors 184, the supplementary capacitors 186, and the light-emitting elements 100 in adjacent three pixels 134 formed over the substrate 132 is illustrated.

Each element included in the pixel circuit is disposed over the substrate 132 through an undercoat 190. The substrate 132 may contain glass, quartz, or plastics. The use of plastic provides flexibility to the substrate 132. As plastics, a polymer such as a polyimide, a polyamide, a polyester, and a polycarbonate is represented, and a polyimide having a high thermal resistivity is preferred among them.

The undercoat 190 may have a single-layer structure as shown in FIG. 8 or may be structured with a plurality of films. In the case of using a plurality of films, a film containing silicon oxide, a film containing silicon nitride, and a film containing silicon oxide may be formed in this order over the substrate 132.

The driving transistor 172 includes a semiconductor film 192, a gate insulating film 194, a gate electrode 196, and source/drain electrodes 200 and 202. The gate insulating film 194 is sandwiched by the gate electrode 196 and the semiconductor film 192. The gate electrode 196 is arranged so as to intersect at least a part of the semiconductor film 192 through the gate insulating film 194, and a channel region 192a is formed in the region where the gate electrode 196 overlaps with the semiconductor film 192. The semiconductor film 192 further possesses low-concentration impurity regions 192c sandwiching the channel region 192a and doped with an impurity as well as source/drain regions 192b sandwiching these regions and doped with an impurity. An impurity concentration in the low-concentration impurity region 192c is lower than that of the source/drain region 192b. The driving transistor 172 is a top-gate type transistor in the example shown in FIG. 8. However, there is no limitation to the structure of the transistors included in the pixel circuit, and a bottom-gate type transistor may be employed. Moreover, there is no limitation to the vertical relationship between the source/drain electrodes 200 and 202 and the semiconductor film 192.

A capacitor electrode 204 existing in the same layer as the gate electrode 196 is disposed so as to overlap with one of the source/drain regions 192b via the gate insulating film 194. An interlayer insulating film 198 is provided over the gate electrode 196 and the capacitor electrode 204. Openings reaching the semiconductor film 192 are formed in the interlayer insulating film 198 and the gate insulating film 194, and the source/drain electrodes 200 and 202 are arranged so as to cover the openings. A part of the source/drain electrode 202 overlaps with a part of the source/drain region 192b and the capacitor electrode 204 via the interlayer insulating film 198, and the storage capacitor 184 is configured by a part of the source/drain region 192b, a part of the gate insulating film 194, the capacitor electrode 204, the interlayer insulating film 198, and a part of the source/drain electrode 202.

A leveling film 206 is further provided over the driving transistor 172 and the storage capacitor 184. The leveling film 206 has an opening reaching the source/drain electrode 202, and a connection electrode 208 covering this opening and a part of a top surface of the leveling film 206 is formed so as to be in contact with the source/drain electrode 202. A supplementary capacitor electrode 210 is further disposed over the leveling film 206. The connection electrode 208 and the supplementary capacitor electrode 210 may be formed simultaneously or may be formed in different steps so as to include different materials. In the former case, the connection electrode 208 and the supplementary capacitor electrode 210 exist in the same layer and possess the same composition.

A supplementary capacitor insulating film 212 is prepared so as to cover the connection electrode 208 and the supplementary capacitor electrode 210. The supplementary capacitor insulating film 212 does not cover a part of the connection electrode 208 in the opening of the leveling film 206 and exposes a top surface of the connection electrode 208, by which electrical connection between the first electrode 102 formed thereover and the source/drain electrode 202 is realized. An opening 214 may be formed in the supplementary capacitor insulating film 212 in order to allow contact between the leveling film 206 and the partition wall 104 formed thereover. Note that the formation of the connection electrode 208 and the opening 214 is optional. The formation of the connection electrode 208 prevents corrosion of a surface of the source/drain electrode 202 in the following process, thereby preventing an increase of contact resistance of the source/drain electrode 202. Impurities in the leveling film 206 can be removed through the opening 214, by which reliability of the pixel circuit and the light-emitting element 100 can be improved.

The first electrode 102 is fabricated over the supplementary capacitor insulating film 212 so as to cover the connection electrode 208 and the supplementary capacitor electrode 210. The supplementary capacitor insulating film 212 is sandwiched by the supplementary capacitor electrode 210 and the first electrode 102, and the supplementary capacitor 186 is formed with this structure. The first electrode 102 is shared by the supplementary capacitor 186 and the light-emitting element 100.

The partition wall 104 is fabricated over the first electrode 102 to cover the edge portion of the first electrode 102. Depressions and projections caused by the first electrode 102 are reduced by the partition wall 104, which prevents disconnection of the EL layer 108 and the second electrode 110 formed thereover. The light-confining layer 106 is provided so as to cover at least a part of the side surface of the partition wall 104, and the EL layer 108 in contact with the first electrode 102 and the light-confining layer 106 is arranged over the first electrode 102. The second electrode 110 in contact with the EL layer 108 is disposed over the EL layer 108.

As an optional structure, a passivation film 216 is arranged over the second electrode 110. The structure of the passivation film 216 may be also arbitrarily determined, and a single-layer structure or a stacked-layer structure may be employed. In the case of a stacked-layer structure, a structure may be utilized where a first layer 216a including a silicon-containing inorganic compound, a second layer 216b including a resin, and a third layer 216c including a silicon-containing inorganic compound are stacked in this order. As a silicon-containing inorganic compound, silicon nitride and silicon oxide are represented. As a resin, an epoxy resin, an acrylic resin, a polyester, a polycarbonate, and the like are exemplified.

2-3. Manufacturing Method

A state is illustrated in FIG. 9A in which the driving transistor 172, the storage capacitor 184, and the supplementary capacitor 186 including the first electrode 102 are formed over the substrate 132 through the undercoat 190. A detailed explanation is omitted because these elements can be fabricated by applying known methods.

The partition wall 104 is formed so as to cover the depressions and projections caused by the edge portion of the first electrode 102 and the opening formed in the leveling film 206 (FIG. 9B). The partition wall 104 includes the material described in the First Embodiment and may be formed by applying the material or a precursor thereof with a spin-coating method, an ink-jet method, or a printing method, followed by performing light exposure, development, and baking on the obtained film.

Figure 10A:
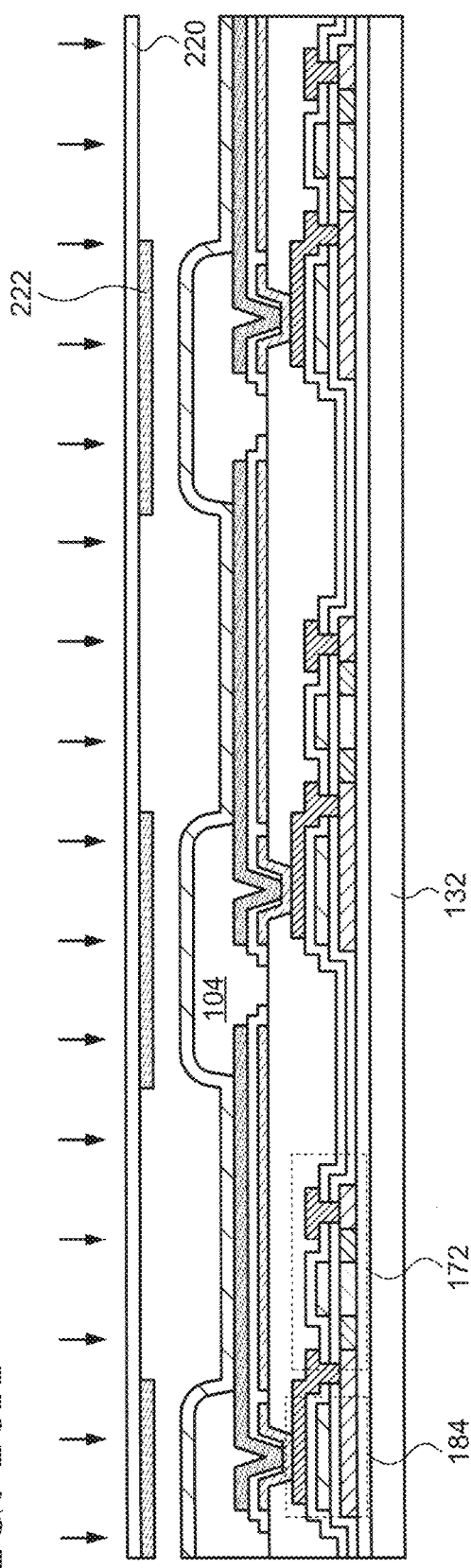
FIG. 10A and FIG. 10B are schematic cross-sectional views explaining a manufacturing method of a display device according to an embodiment of the present invention.
Figure 10B:
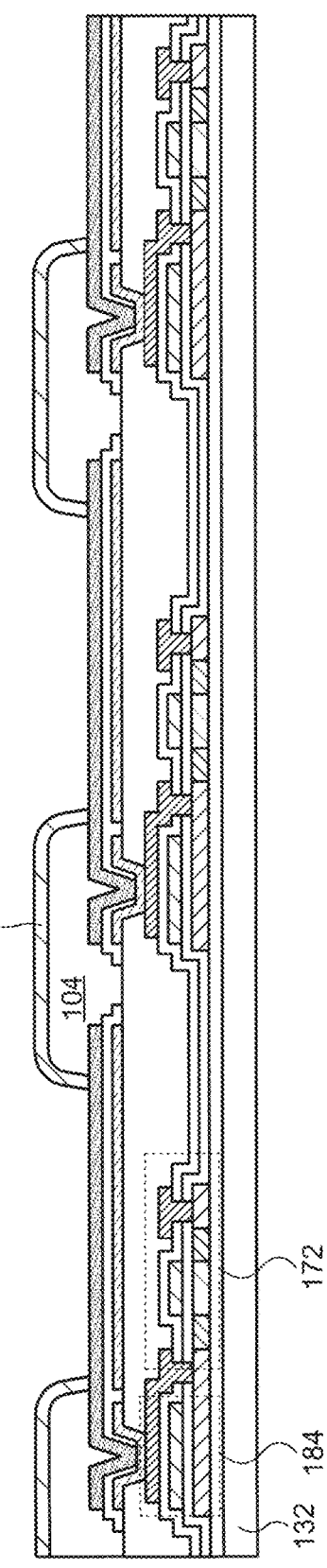

Next, the light-confining layer 106 covering at least a part of the side surface of the partition wall 104 and in contact with the partition wall 104 and the first electrode 102 is formed. Specifically, the polymer described in the First Embodiment or a precursor thereof is applied over the partition wall 104 and the first electrode 102 by applying a spin-coating method, an ink-jet method, or a printing method (FIG. 9B). After that, light-exposure is carried out through a photomask 220 (FIG. 10A). The photomask 220 is provided with a light-shielding portion 220 blocking light to be applied, and the photomask 220 is arranged over the substrate 132 so that the light-shielding portion 222 overlaps with the region in which the light-confining layer 106 is to be prepared. After that, light exposure, development using an etchant, and baking are carried out to form the light-confining layer 106 (FIG. 10B). Note that, when an inorganic compound is used, the light-confining layer 106 may be fabricated by forming a film of an inorganic compound with an evaporation method, a sputtering method, a chemical vapor deposition (CVD) method, or the like, followed by processing the film with etching.

After that, the EL layer 108 in contact with the first electrode 102 and the light-confining layer 106 is formed over the first electrode 102 by applying an evaporation method, an ink-jet method, a spin-coating method, or the like. Next, the second electrode 110 is formed over the EL layer 108 by using an evaporation method or a sputtering method (FIG. 11A). The passivation film 216 is prepared over the second electrode 110 (FIG. 11B). A detailed explanation is omitted because the EL layer 108, the second electrode 110, and the passivation film 216 can be prepared by applying known methods.

Through the processes describe above, the display device 130 can be manufactured. As can be understood from the above explanation, the display device 130 can be manufactured by utilizing common semiconductor-manufacturing processes. Hence, implementation of the present embodiment allows production of the display device 130 without providing large stress on the process. In addition, the light-emitting element 100 is capable of showing excellent color purity and high emission efficiency. Therefore, the present embodiment enables production of a display device having high color reproducibility and low power consumption.

The aforementioned modes described as the embodiments of the present invention can be implemented by appropriately combining with each other as long as no contradiction is caused. Furthermore, any mode which is realized by persons ordinarily skilled in the art through the appropriate addition, deletion, or design change of elements or through the addition, deletion, or condition change of a process is included in the scope of the present invention as long as they possess the concept of the present invention.

In the specification, although the cases of the organic EL display device are exemplified, the embodiments can be applied to any kind of display devices of the flat panel type such as other self-emission type display devices, liquid crystal display devices, and electronic paper type display device having electrophoretic elements and the like. In addition, it is apparent that the size of the display device is not limited, and the embodiment can be applied to display devices having any size from medium to large.

It is properly understood that another effect different from that provided by the modes of the aforementioned embodiments is achieved by the present invention if the effect is obvious from the description in the specification or readily conceived by persons ordinarily skilled in the art.

What is claimed is:

1. A light-emitting element comprising:
a first electrode;
a partition wall covering an edge portion of the first electrode;
a light-confining layer in contact with a side surface of the partition wall and the first electrode;
an electroluminescence layer over the first electrode and in contact with the first electrode and the light-confining layer; and
a second electrode over the electroluminescence layer,
wherein a refractive index of the light-confining layer is lower than a refractive index of the electroluminescence layer.

2. The light-emitting element according to claim 1, wherein a permittivity of the light-confining layer is lower than a permittivity of the electroluminescence layer.

3. The light-emitting element according to claim 1, wherein an angle between the side surface of the partition wall and a surface of the partition wall in contact with the first electrode is equal to or more than 80° and less than 90°.

4. The light-emitting element according to claim 1, wherein a width of a surface of the light-confining layer in contact with the first electrode is equal to or more than 50 nm and equal to or less than 200 nm.

5. The light-emitting element according to claim 1, wherein the light-confining layer is in contact with a top surface of the partition wall.

6. The light-emitting element according to claim 1, wherein the second electrode is in contact with the light-confining layer.

7. The light-emitting element according to claim 1, wherein the second electrode is in contact with the partition wall.

8. The light-emitting element according to claim 1, wherein the first electrode has a reflective surface reflecting visible light, and
an optical distance between the reflective surface and the second electrode is an odd multiple of one fourth of an emission wavelength of the electroluminescence layer.

9. A display device comprising:
a first light-emitting element;
a second light-emitting element adjacent to the first light-emitting element; and
a partition wall between the first light-emitting element and the second light-emitting element each comprising:
a first electrode having an edge portion covered by the partition wall;
a light-confining layer in contact with a side surface of the partition wall and the first electrode;
an electroluminescence layer over the first electrode and in contact with the first electrode and the light-confining layer; and
a second electrode over the electroluminescence layer,
wherein a refractive index of the light-confining layer is lower than a refractive index of the electroluminescence layer in each of the first light-emitting element and the second light-emitting element.

10. The display device according to claim 9,
wherein a permittivity of the light-confining layer is lower than a permittivity of the electroluminescence layer in each of the first light-emitting element and the second light-emitting element.

11. The display device according to claim 9,
wherein an angle between the side surface of the partition wall and a surface of the partition wall in contact with the first electrode is equal to or more than 80° and less than 90° in each of the first light-emitting element and the second light-emitting element.

12. The display device according to claim 9,
wherein a width of a surface of the light-confining layer in contact with the first electrode is equal to or more than 50 nm and equal to or less than 200 nm in each of the first light-emitting element and the second light-emitting element.

13. The display device according to claim 9,
wherein the light-confining layer is in contact with a top surface of the partition wall and shared by the first light-emitting element and the second light-emitting element.

14. The display device according to claim 9,
wherein the second electrode is shared by the first light-emitting element and the second light-emitting element and in contact with the light-confining layers of the first light-emitting element and the second light-emitting element.

15. The display device according to claim 9,
wherein the second electrode is shared by the first light-emitting element and the second light-emitting element and in contact with the partition wall.

16. The display device according to claim 9,
wherein, in each of the first light-emitting element and the second light-emitting element:
the first electrode has a reflective surface reflecting visible light; and
an optical distance between the reflective surface and the second electrode is an odd multiple of one fourth of an emission wavelength of the electroluminescence layer.

17. A light-emitting element comprising:
a first electrode;
a partition wall covering an edge portion of the first electrode;
a first light-confining layer covering at least a part of a side surface of the partition wall;
a second light-confining layer between and in contact with the first light-confining layer and the partition wall;
an electroluminescence layer over the first electrode and in contact with the first electrode and the first light-confining layer; and
a second electrode over the electroluminescence layer,
wherein a refractive index of the second light-confining layer is lower than a refractive index of the electroluminescence layer and a refractive index of the first light-confining layer.

18. A display device comprising:
a first light-emitting element;
a second light-emitting element adjacent to the first light-emitting element; and
a partition wall between the first light-emitting element and the second light-emitting element each comprising:
a first electrode having an edge portion covered by the partition wall;

a first light-confining layer covering at least a part of a side surface of the partition wall;

a second light-confining layer between and in contact with the first light-confining layer and the partition wall;

an electroluminescence layer over the first electrode and in contact with the first electrode and the first light-confining layer; and a second electrode over the electroluminescence layer, wherein a refractive index of the second light-confining layer is lower than a refractive index of the electroluminescence layer and a refractive index of the first light-confining layer.

* * * * *